United States Patent
D'Evelyn et al.

(10) Patent No.: US 7,316,746 B2
(45) Date of Patent: Jan. 8, 2008

(54) CRYSTALS FOR A SEMICONDUCTOR RADIATION DETECTOR AND METHOD FOR MAKING THE CRYSTALS

(75) Inventors: Mark Philip D'Evelyn, Niskayuna, NY (US); Dong-Sil Park, Niskayuna, NY (US); John Thomas Leman, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 287 days.

(21) Appl. No.: 11/082,846

(22) Filed: Mar. 18, 2005

(65) Prior Publication Data

US 2006/0207497 A1    Sep. 21, 2006

(51) Int. Cl.
- *C30B 28/06* (2006.01)
- *C30B 29/48* (2006.01)
- *C30B 29/50* (2006.01)
- *H01L 21/00* (2006.01)

(52) U.S. Cl. .............................. 117/71; 117/6; 117/21; 117/36; 117/74; 117/78; 117/89; 117/100; 117/109; 117/216; 117/957; 117/958; 438/95; 438/900

(58) Field of Classification Search .................. 117/21, 117/36, 74, 78, 71, 6, 89, 100, 109, 216, 957, 117/958; 438/95, 900
See application file for complete search history.

(56) References Cited

U.S. PATENT DOCUMENTS

| | | | | |
|---|---|---|---|---|
| 4,923,561 A | * | 5/1990 | Chemans et al. | 117/83 |
| 6,673,647 B2 | * | 1/2004 | Pelliciari | 438/95 |
| 2002/0192929 A1 | * | 12/2002 | Pelliciari | 438/478 |
| 2003/0140845 A1 | | 7/2003 | D'Evelyn et al. | |
| 2003/0141301 A1 | | 7/2003 | D'Evelyn et al. | |
| 2004/0000266 A1 | * | 1/2004 | D'Evelyn et al. | 117/2 |
| 2004/0134415 A1 | | 7/2004 | D'Evelyn et al. | |
| 2004/0245535 A1 | | 12/2004 | D'Evelyn et al. | |

FOREIGN PATENT DOCUMENTS

WO    WO 03/014428 A2    2/2003

OTHER PUBLICATIONS

"Charge Trapping in XR-100T-CdTe and CZT Detectors Application Note (ANCZT-2 Rev. 2)", http://www.amptek.com/anczt2.html, printed Nov. 4, 2004, pp. 1-22.

(Continued)

*Primary Examiner*—Yogendra N. Gupta
*Assistant Examiner*—G. Nagesh Rao
(74) *Attorney, Agent, or Firm*—Nixon & Vanderhye P.C.

(57) ABSTRACT

A method for a growing solid-state, spectrometer grade II-VI crystal using a high-pressure hydrothermal process including the following steps: positioning seed crystals in a growth zone of a reactor chamber; positioning crystal nutrient material in the nutrient zone of the chamber; filling the reactor with a solvent fluid; heating and pressuring the chamber until at least a portion of the nutrient material dissolves in the solvent and the solvent becomes supercritical in the nutrient zone; transporting supercritical from the nutrient zone to the growth zone, and growing the seed crystals as nutrients from the supercritical fluid deposit on the crystals.

9 Claims, 4 Drawing Sheets

OTHER PUBLICATIONS

Ronald M. Keyser, "Characterization of Room Temperature Detectors Using The Proposed IEEE Standard", manuscript received Nov. 5, 2001, pp. 1-4.

Uri Lachish, "CdTe and CdZnTe Crystal Growth and Production of Gamma Radiation Detectors", http://urila.tripod.com/crystal.htm, printed Nov. 4, 2004, pp. 1-16.

Michael Fiederle et al, "Materials For Semiconductor Detectors: CdTe and CdZnTe", http://www.science24.com/emrs2004fall/php/abstractView.phtml?2384, printed Nov. 4, 2004.

T. Takahashi et al., "Application of CdTe for the NeXT Mission", Hiroshima Conference 2004, pp. 1-18.

M. Fiederle et al, Growth of High Resistivity CdTe and (Cd,Zn)Te Crystals, Cryst. Res. Technol. 38, No. 7-8, 588-597 (2003).

R.S. Rai et al., Characterization of CdTe, (Cd,Zn)Te, and Cd(Te,Se) Single Crystals By Transmission Electron Microscopy, http://scitation.aip.org/getabs/servlet/GetabsServlet, printed Nov. 4, 2004, pp. 1-2.

J. Franc et al., "The Influence of Growth Conditions On the Quality of CdZnTe Single Crystals", http://www.iop.org/EJ/abstracts, printed Nov. 4, 2004, pp. 1-3.

R. Triboulet, "Crystal Growth of CdTe AND (CdZn)Te", http://www.fist.fr/index.php, printed Nov. 4, 2004, pp. 1-2.

Wanwan Li et al., "$Cd_{1-x} Zn_x$ Te Crystal Growth Controlled By Cd/Zn Partial Pressures", Semicond. Sci. Technol. 17 (2002), L55-L58.

"Young Scientist, Dr. Keitaro Hitomi", SAP International No. 6 (Jul. 2002).

A. Drighil et al., Properties of $Cd_{1-x} Zn_x$ Te Crystals Grown By High Pressure Bridgman (HPB), MJ Condensed Matter, pp. 1-4.

"Next Generation Solid State Radiation Detectors", GE Proprietary Information, pp. 1-5.

E.D. Kolb et al., Hydrothermal Crystallization of Some II-VI Compounds, Journal of Crystal Growth e, 4 (1968), 422-425.

* cited by examiner

CRYSTALS FOR A SEMICONDUCTOR RADIATION DETECTOR AND METHOD FOR MAKING THE CRYSTALS

BACKGROUND OF THE INVENTION

The field of the invention is high grade, II-VI semiconductor crystal growth using high-pressure hydrothermal processes and, in particular, growth of large Cadmium Telluride (CdTe) and Cadmium Zinc Telluride (CZT) crystals.

CdTe and CZT crystals have applicability for compact radiation detectors. CdTe and CZT detectors have been shown to exhibit good energy resolution, especially as compared to scintillator-based detectors. Since they are direct conversion devices, CdTe and CZT detectors eliminate the need for bulky photomultiplier tubes. Furthermore, CdTe and CZT detectors do not require cryogenic cooling as do high-purity germanium detectors.

CdTe and CZT crystals are conventionally grown by melting CdTe and CZT and allowing the melt to crystallize. Traveling heater systems, horizontal Bridgman, vertical Bridgman and high pressure Bridgman methods have been used to grow CdTe and CZT crystals from the melt or from the vapor phase. CdTe and CZT crystals grown by such melt and vapor phase processes tend to suffer from high cost and small crystal size. In addition, the crystals produced by these melt and vapor phase processes tend to have poor electrical and physical characteristics that greatly limit their sensitivity and application to economical radiation detectors. There is a long felt need for a robust technique for growing high purity, low-cost single CdTe and CZT crystals of a size suitable for high sensitivity detection at high resolution.

BRIEF DESCRIPTION OF THE INVENTION

A method for making solid-state, spectrometer grade cadmium telluride (CdTe) and cadmium zinc telluride (CZT) crystals has been developed. CdTe and CZT crystals may be grown by a high-pressure hydrothermal process that produces large single crystals. The process delivers high crystal yields at a low cost and with good spectral resolution.

The CdTe and CZT crystals may be applied in gamma ray and x-ray detectors to provide high resolution and improved detector sensitivity. Examples of other uses of the CdTe and CZT crystals include enhanced Hand-Held Radioisotope Identification Devices, Area Search Devices and image arrays for Radiography, digital x-ray detector arrays, and computed tomography systems.

The invention may be embodied as a method for a growing solid-state, spectrometer grade II-VI crystals using a high-pressure hydrothermal process including the following steps: positioning seed crystals in a growth zone of a reactor chamber; positioning crystal nutrient material in the nutrient zone of the chamber; filling the reactor with a solvent fluid; heating and pressurizing the chamber until at least a portion of the nutrient material dissolves in the solvent and the solvent becomes supercritical; transporting nutrient material dissolved in the supercritical fluid from the nutrient zone to the growth zone, and growing the seed crystals as nutrient material dissolved in the supercritical fluid deposits onto the crystals.

The invention may also be embodied as a method for growing Cadmium Telluride (CdTe) and Cadmium Zinc Telluride (CZT) crystals comprising: positioning CZT or CdTe seed crystals in a growth zone of a reactor chamber divided by a porous baffle into the growth zone and a nutrient zone; positioning CZT or CdTe nutrient material in the nutrient zone; filling the reactor chamber with a solvent fluid; heating and pressurizing the reactor such that the solvent fluid becomes supercritical; heating the reactor such that the nutrient zone at a different temperature than the growth zone; dissolving the nutrient material into the supercritical fluid; transporting the supercritical fluid with dissolved nutrient through the baffle and to the growth zone, and growing crystals from the seed crystals as the dissolved nutrients deposit on the crystals.

Further, the invention may be embodied as a solid-state, spectrometer grade crystal, wherein the crystal is formed by: positioning seed crystals in a growth zone of a reactor chamber; positioning crystal nutrient material in the nutrient zone of the chamber; filling the reactor with a solvent fluid; heating and pressurizing the chamber until at least a portion of the nutrient material dissolves in the solvent and the solvent becomes supercritical; transporting supercritical fluid from the nutrient zone to the growth zone, and growing the seed crystals as nutrients from the supercritical fluid deposit onto the crystals.

DETAILED DESCRIPTION OF THE INVENTION

For direct conversion detection of x-rays or gamma rays, a high quality, wide-bandgap semiconductor comprising high-atomic-number elements is desired to provide a high cross section for absorption of radiation, a low electrical conductivity for a low background count rate, and a high carrier mobility and lifetime, for efficient detection of carriers. Pure CdTe may be suitable for these purposes, but incorporation of unintentional impurities and defects may increase the electrical conductivity to an undesirably high value. The conductivity may be reduced by addition of at least one compensatory dopant, but at the cost of a reduced carrier mobility. ZnTe may be added to the CdTe, forming CdZnTe (or CZT) order to increase the bandgap and decrease the conductivity. A similar effect may be achieved by incorporation of CdSe or ZnSe, forming $Cd_{1-x}Zn_xSe_yTe_{1-y}$, where $0 \leq x,y \leq 1$.

Hydrothermal processes are conventionally used to grow α-quartz crystals commercially. The term hydrothermal also refers to solvothermal processes where the supercritical fluid is a substance other than water, such as ammonia or methanol. These processes provide a highly isothermal and uniform crystal growth environment due to the gas-like viscosity of the supercritical fluid solvent in the reactor chamber and the self-convection of the fluid produced by the reactor. Conventional hydrothermal autoclave systems operate at pressures and temperatures up to about 2 kbar and 400° C., respectively or, with the use of nickel-based superalloys, up to about 5 kbar and 550° C. When working with strongly corrosive solvents, Morey-type autoclaves with a maximum pressure of about 0.5-1 kbar are typically used. Hydrothermal pressure vessel reactors and pressure chambers with enhanced pressure and temperature capability, up to as high as 80 kbar and 1500° C., are disclosed in U.S. Patent Application Publications 2003/0141301, 2003/0140845, 2004/0134415, and U.S. patent application Serial Number (not yet assigned) entitled "Apparatus For Processing Materials In Supercritical Fluids And Methods Thereof", naming as inventors M. P. D'Evelyn et al., and filed in the USPTO on Jan. 25, 2005, (GE reference 155899) all of which are commonly owned with this application and are incorporated by reference herein in their entirety.

Figure 1:
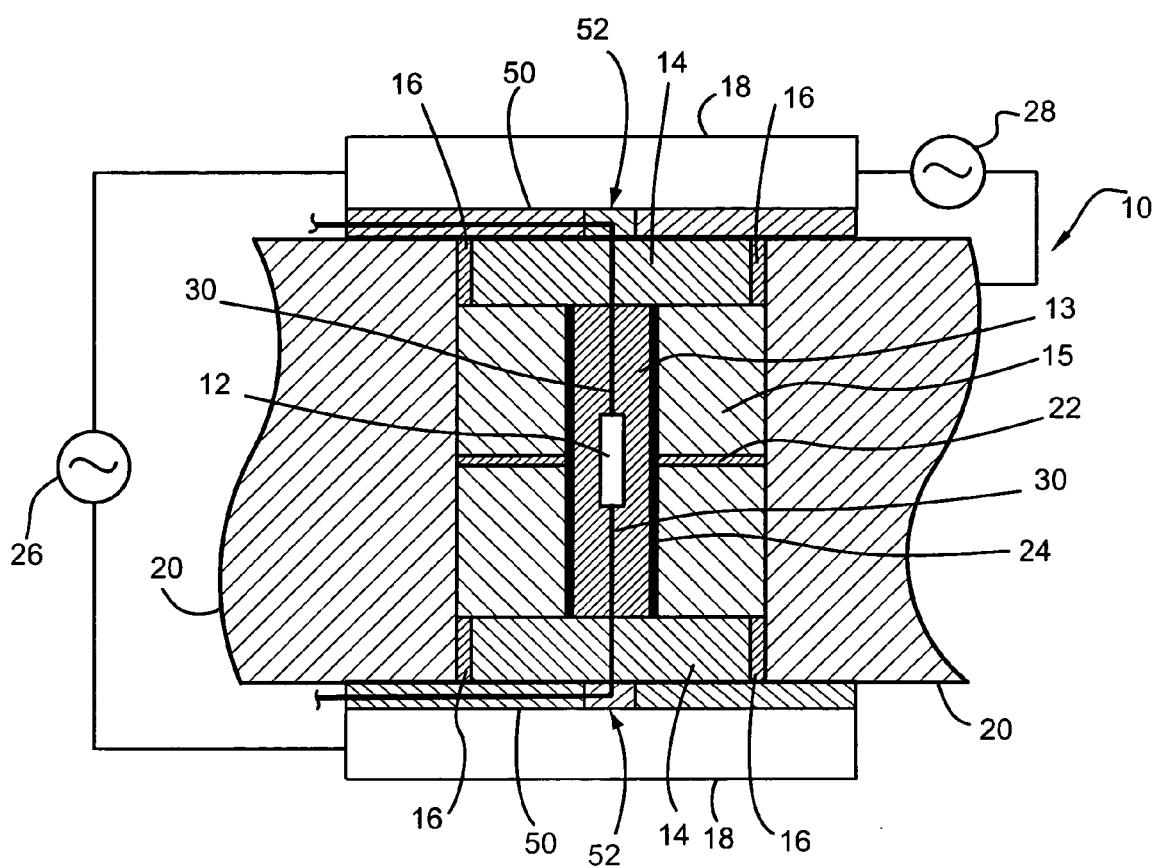
FIG. 1 is a cross-sectional view of a zero-stroke-type pressure apparatus with a chamber for growing crystals.

FIG. 1 illustrates a zero-stroke-type pressure apparatus 10. The performance of a high-pressure and high-temperature (HP/HT) apparatus may be characterized by its pressure response, which is defined as the percent increase in chamber pressure divided by the percent increase in press force that produces the increased chamber pressure, relative to a reference operating condition. As known in the art, a zero stroke apparatus is one in which the pressure response is below 0.2, and, more preferably below, 0.05.

A zero stroke apparatus is typically easier to control in supercritical-fluid-processing applications than other apparatuses, and is able to capture or contain the pressure generated within the capsule with little or no tendency to crush it. Although some stroking (e.g., an increase or decrease in the separation between the punches or anvils) may occur during operation, the extent of stroking is much smaller than in other designs. Alternatively, a conventional pressure device may be used to pressurize the chamber. A suitable pressure device having a chamber, pressure transmission medium, restraint seal and heater is described in published U.S. Patent Application Pub. No. 2003/0140845, published on Jul. 31, 2003, entitled "Improved Pressure Vessel," and incorporated herein by reference in its entirety.

The zero-stroke apparatus 10 is a HP/HT apparatus comprising a chamber 12 for growing crystals (or processing material) in a liquid or solid pressure transmitting medium 13, with at least one electrical insulator in the apparatus for establishing at least two different electrical heating paths in a heating element and a power system, for independently controlling the temperatures of at least two locations in the cell, wherein the temperature gradient between the seed crystal and the source material is temporally varying so as to produce an increasing growth rate during at least a portion of the growing process.

The zero-stroke-type pressure apparatus 10 may include opposite steel endcaps 14 that are each surrounded by an annular pyrophyllite bushing 16 which, along with gasket 50, electrically insulates opposite anvils 18 from the annular die 20. Electrically-conductive element 52 establishes an electrical path between anvils 18 and endcaps 14. An electrically conductive annulus 22 is interposed about midway between the top and bottom of annular heating element 24 to thermally divide the reaction chamber 12 into an upper section and a lower section. The heating element 24 may be in the form of a heating tube, or a heated foil, ribbon, bar, wire, ring, or combinations thereof. The conductive annulus 22 has an inner surface in contact with the heating element 24 and an outer surface in contact with the die 20.

A main heater power circuit 26 is applied between anvils 18, and differential heater power circuit 28 is applied between the die 20 and either of the anvils 18. Alternatively, one heater circuit 26 can be applied between the die 20 and first anvil 18 and another circuit 28 applied between the die 20 and the second anvil 18. To monitor or control the temperature at the two positions within the chamber, for example, at the chamber top and bottom, temperature sensors 30 are inserted through the cell components and to desired positions in contact with or within the chamber, e.g., one sensor at the upper section and another at the lower section.

The chamber 12 is surrounded by a solid or liquid pressure transmission medium 13, such as sodium chloride salt. An annular bushing 15 supports the cylindrical heating element 24 and the pressure transmission medium 13. The assembly of the bushing 15, heater 24, transmission medium 13 and capsule 12 are encased in the die 20 and between the anvils 18.

The chamber 12 may be self-pressurizable up to between 1 atm (about 1 bar) and about 80 kbar. For example, the chamber may be is pressurizable up to between about 700 bar and about 80 kbar, including 2 kbar and 5 kbar. The chamber 12 may be formed from a deformable material, such as copper, copper-based alloys, gold, silver, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, combinations thereof, and the like.

Figure 2:
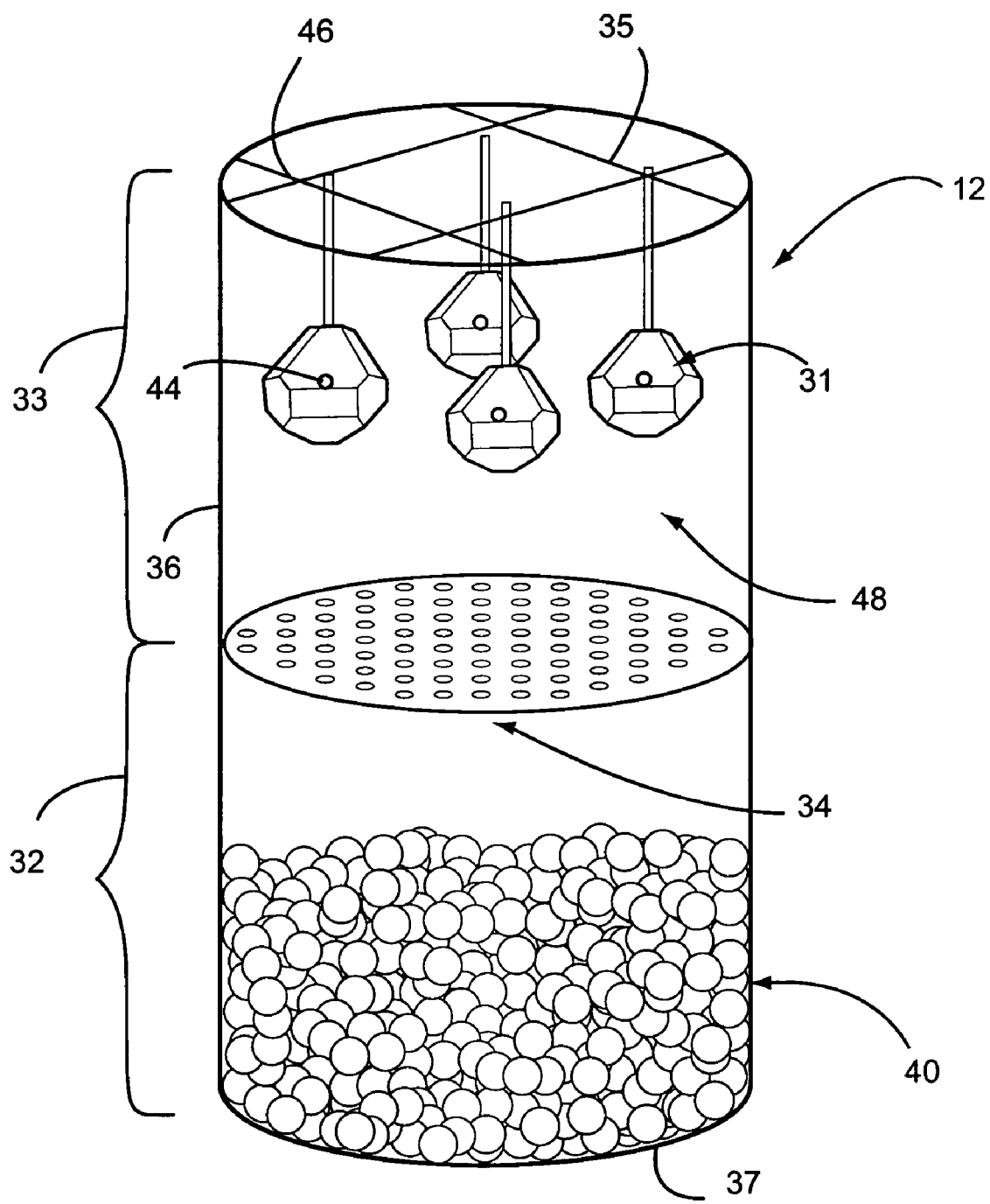
FIG. 2 is a schematic diagram of the chamber for growing CdTe and CZT crystals by a high-pressure hydrothermal method.

FIG. 2 is a schematic diagram of the reactor chamber 12 for growing CdTe and CZT crystals 31. The hydrothermal pressure reactor chamber 12 is divided into a nutrient zone 32 and a crystal growth zone 33. The zones are separated by a porous baffle 34. The chamber 12 is filled with a solvent fluid 48 to form a substantially air-free environment that is subjected to high pressure and high temperature (HP/HT) processing conditions. The solvent and HP/HT conditions promote growth of single crystal material on seed crystals using dissolved crystal nutrient raw materials.

The chamber includes a closed end 37, at least one wall adjoining the closed end, e.g. a cylindrical wall 36, and a sealed end 35 opposite to the closed end. The sealed end of the chamber is opened to receive nutrients 40 (e.g., crystal raw materials), solvent fluid 48 and seed crystals 44. When the sealed end is sealed, the chamber defines a closed HP/HT reactor chamber. The nutrient and a solvent within the chamber become a supercritical fluid at high temperatures and high pressures.

As the temperature of the chamber 12 is increased by applying power to the heating element, the pressure inside the chamber increases due to the equation of state of the solvent. The chamber deforms outward slightly due to the internal pressure, but is prevented from large deformation by forces applied to the pressure transmission medium. The chamber is fluid impermeable and chemically inert with respect to the reactant and the supercritical fluid under processing conditions. The processing conditions are generally above about 700 bar and 375° Celsius (C.), and more typically above about 2 kilo-bar and 450° C. Preferably, the processing pressures are between 700 bar and 80 kilo-bar (kbar) and the processing temperatures are between 375° C. and about 1500° C.

The baffle 34 may be a barrier disk with a plurality of through holes. The baffle may be formed of copper, copper-based alloy, gold, silver, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, silica, alumina, and combinations thereof. The proportion of open holes to solid disk in the baffle may be, for example, 0.5% to 30%.

Figure 3:
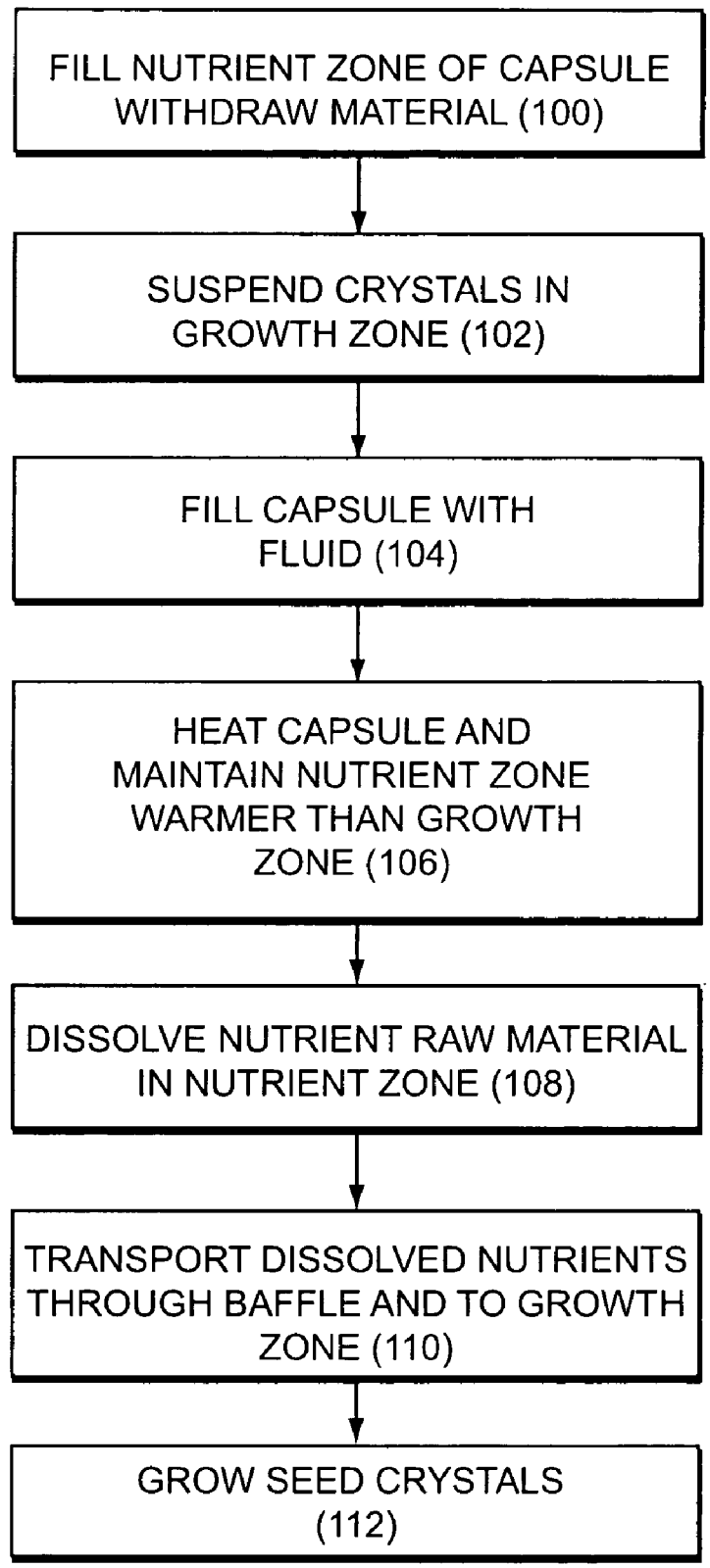
FIG. 3 is a flow chart of an exemplary method for growing these crystals.

FIG. 3 is a flow chart of a method to grow CdTe and CZT crystals using an HPHT process. The nutrient zone 32 of the chamber is at least partially filled with raw nutrient material

40, e.g., at least one of polycrystalline, amorphous, or single crystal Cd, Te, Zn, Se, CdTe, ZnTe, ZnSe, CdSe, CdZnTe, or $Cd_{1-x}Zn_xSe_yTe_{1-y}$, where $0 \leq x, y \leq 1$, in step 100. The raw nutrient material is preferably of ultra high purity, with less than 10 ppm, and even more preferably less than 1 ppm, of adventitious impurities. The $Cd_{1-x}Zn_xSe_yTe_{1-y}$, where $0 \leq x, y \leq 1$, raw material 42 provides nutrients to deposit single-crystal material on the seed crystals 44. The seed crystals are positioned in the growth zone, such as by suspending the crystals from a rack 46, in step 102. The growth zone may be relatively large, such as up to about a meter in diameter and up to about ten meters in height. Large numbers of seed crystals may be arranged in a grid array and suspended from one or more racks in the growth zone. The distance across the grid array of seed crystals may be several meters.

Chamber 12 is filled with a solvent 48 and a mineralizer. The mineralizer is at least one substance that is added to the solvent to increase the solubility of the nutrient and crystal material in the solvent. In one embodiment, the solvent is water and the mineralizer is at least one alkali hydroxide or carbonate. In another embodiment, the mineralizer is at least one of a halogen and its reaction products with the nutrient material, and the solvent is ammonia or an organic such as ethylenediamine, methanol or ether.

The solvent 48 and mineralizer may be added to the chamber in several ways. In one embodiment, the mineralizer is added to the chamber, a vacuum manifold evacuates the chamber and then the solvent is added to the chamber from the vapor phase and condensed into the chamber, for example, by chilling the chamber, in step 104. In another embodiment, the chamber is evacuated by a vacuum manifold and the solvent is added as a liquid. In yet another embodiment, the solvent is added as a liquid while the chamber is open to the atmosphere, then the chamber is closed and evacuated. In still another embodiment, the mineralizer is pre-dissolved in the solvent and added as a liquid to the chamber. Dissolved gases may be removed from the solvent, for example, by boiling, prior to addition to the chamber.

The chamber 12 may be sealed in several ways. In one embodiment, a plug is inserted into one end of the chamber. In another embodiment, a lid with a fill tube is welded to one end of the chamber prior to final evacuation of the chamber, then closed off, for example, by welding.

The chamber 12 is positioned in a large high pressure apparatus 10 having a heater 24 and a press/punch anvil 18. The solvent, raw materials, and mineralizer are placed in the inert, hermetically-sealed but deformable chamber 12 and encased in a pressure medium 13 in the cavity defined by the die 20 and anvil 18. The heater is capable of maintaining the chamber at high and uniform temperatures required for the processing temperature. The press applies forces to the chamber to prevent deformation and failure due to self-pressurization of the fluid within the chamber. An apparatus controller regulates the forces applied by the press/punch and the temperatures applied by the heater.

The heater circuits 26, 28 maintain the zones 32, 33 in the chamber 12 at uniform and elevated temperatures, in step 106. The temperature in the growth zone may be above 375° C., including for example 450° C. and 550° C. In the case where the solubility of the nutrient material in the super-critical solvent increases with temperature, the temperature in the nutrient zone is maintained at a slightly higher temperature than the temperature in the growth zone, e.g., above 400° C. For example, the nutrient zone may be maintained 1° C. to 100° C. warmer than the growth zone, and particularly 5° C. to 20° C. warmer. In the case where the solubility of the nutrient material in the supercritical fluid solvent decreases with temperature, the temperature of the nutrient zone is maintained at a lower temperature, by about 1 to 100° C., than the growth zone. Typically, in the case of solubility with a negative temperature coefficient, the positions of the growth zone and nutrient zones are reversed with respect to the configuration shown in FIG. 2, with the growth zone in the lower portion of the chamber and the nutrient zone in the upper portion. The heater maintains highly uniform temperatures in each zone. The heater circuits 26, 28 control the temperature in the chamber. Power is applied to the heating circuits to heat the chamber from the starting temperature to the operating temperature in between about 30 min and about 6 hr, held at the operating temperature for between about 1 hr and about 2000 hr, and cooled to room temperature in between about 30 min and about 24 hr. The temperature difference between the growth zone and the nutrient zone may be adjusted during the course of the run for improved process control. For example, a temperature difference during the early part of the run that is reduced in magnitude or even reversed in sign from that employed later in the run may allow for reduced spontaneous nucleation and improved crystal quality.

The vapor pressure of the solvent at a given temperature can be determined from the equation of state or phase diagram of the solvent. At sufficiently high processing temperatures and pressures the solvent fluid and dissolved nutrients becomes a supercritical fluid.

In the case where the solubility of the source material is an increasing function of temperature, the nutrient raw material 40 dissolves in the nutrient zone 32 which is at a slightly higher temperature than the growth zone, in step 108. The dissolved nutrient is transported to the growth zone and supersaturates the growth zone, in step 110. The dissolved nutrients are transported by convection as the warmer fluid in the nutrient zone flows towards the cooler growth zone and vice versa. The warmer solvent (supersaturated with nutrients) in the nutrient zone rises and the cooler solvent (in which some of the nutrients have attached to the seed crystals) in the growth zone sinks because of density differences, causing the reactor to be self stirring. Crystal growth on the seed crystal is promoted in the supersaturated growth zone, in step 112.

The dissolved nutrients flow through the baffle 34. The baffle separates the growth and nutrient zones, but allows supercritical fluid to flow between the zones under HPHT conditions. The baffle also assists in maintaining the growth and nutrient zones at different temperatures.

The combination of convection and low viscosity enable extremely uniform crystal growth conditions, so that (for example) several hundred $2.5 \times 2.5 \times 15$ cm$^3$ crystals can be grown in a single large high pressure chamber and during a single batch process, in step 112. Independent crystals may be suspended in the growth zone of the chamber. Crystals separated by several meters in the chamber will still experience the same growth rate because the temperature and pressure in the growth zone is uniform. In addition, individual crystals experience zero thermal stress and may form dislocation-free crystals several cm in diameter. The growing crystals are never in contact with a melt.

Figure 4:
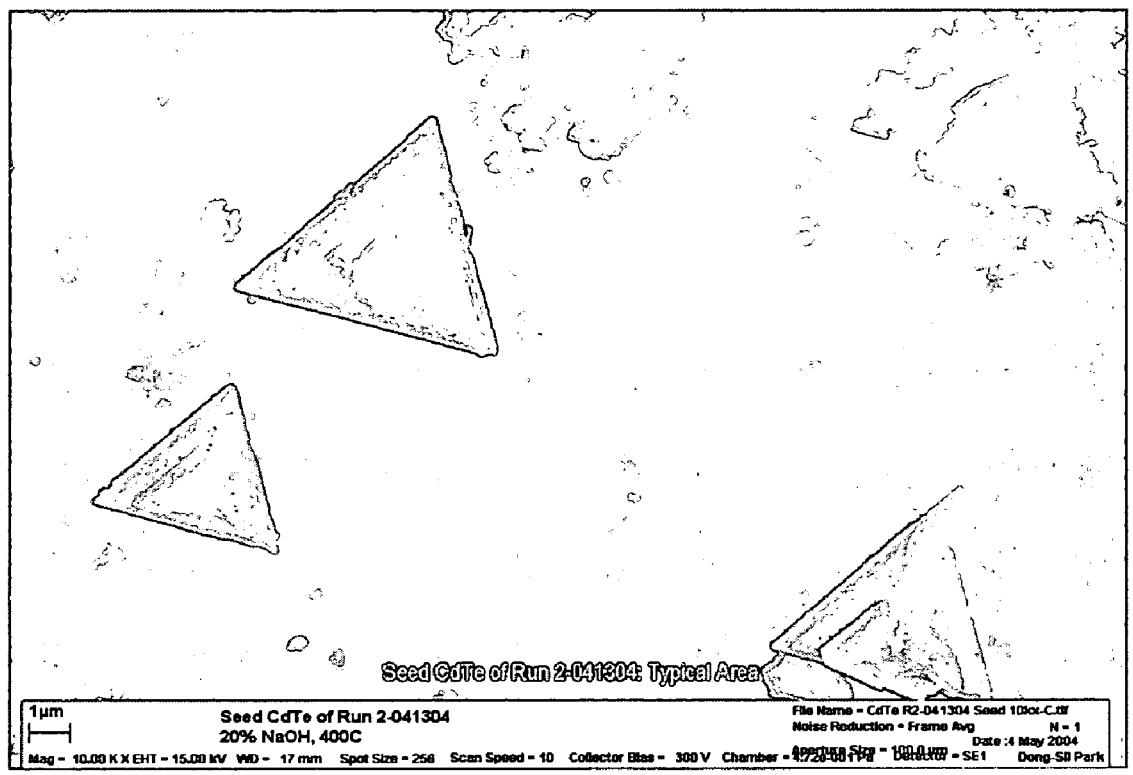
FIG. 4 is a scanning electron micrograph (SEM) image of spiral growth features on a CdTe(111) seed, indicating high quality crystal growth on screw dislocations.

FIG. 4 is a scanning electron micrograph (SEM) image of spiral growth features of a CdTe crystal grown on a CdTe (111) seed, indicating high quality crystal growth on screw dislocations. The crystal shown in FIG. 4 was grown from a (111)-oriented CdTe seed crystal, approximately 5 mm in diameter and about 1141 μm thick. The seed crystal was placed at the bottom of a copper capsule having a 25 μm thick gold coating on its inner surface. A gold coated copper baffle, with 5% open area, was placed in the middle of the capsule. The source material was 1.07 grams (g) of polycrystalline CdTe that was placed on top of a 40×40 mesh Mo wire cloth. The capsule was then filled with with 2.17 g of 20M NaOH, corresponding to a fill of about 80% to 85%. The capsule was placed along with a 0.583 inch diameter steel ring in a filler/sealing assembly. A gold-coated copper plug was then was inserted into the open top end of the capsule, such that a cold weld was formed between the gold-coated copper capsule and the gold-coated copper plug and the steel ring surrounded the plug and provided reinforcement. The capsule was then removed from the filler/sealing assembly and inserted in a zero stroke HPHT apparatus. The cell was heated at a rate of about 6.3° C./min. until the temperature of the bottom of the capsule was approximately 390° C. and the temperature of the top half of the capsule was approximately 400° C., as measured by type K thermocouples. The capsule was held at these temperatures for about 8 hr, then cooled and removed from the press. Upon opening the capsule, the thickness of the seed was found to have increased by 20.65 µm, corresponding crystal was examined by scanning electron microscopy. The scanning electron micrograph (SEM) image of FIG. 4 shows the spiral growth features of the CdTe crystal that indicates high quality crystal growth on screw dislocations. With higher temperatures, e.g., above 450° C. or 550° C., and optimization of the process higher crystal growth rates are expected, such as 30-50 µm/hr. This particular experiment used a capsule geometry which differs from that shown in FIG. 1, in that the seed was on the bottom. Nevertheless, the solubility increased with temperature and the bottom was cooler than the top. Higher crystal growth rates are expected, such as 30-50 µm/hr., when the process is used with higher temperatures, e.g., above 500° C.

Despite the very high purity and crystalline quality of CdZnSeTe crystals grown by the present method, the presence of low concentrations of adventitious impurities and native defects such as vacancies and interstitials may render unintentionally doped crystals conductive, which is undesirable for many radiation detector applications. This undesirable electrical conductivity may be greatly reduced by adding at least one compensatory dopant to the CdZnSeTe crystals. For example, at least one of Cl, Ge, Sn, In, B, Al, Ga, Tl, C, Si, Pb, N, P, As, Sb, Bi, F, Br, I, a transition metal, a rare earth metal, or H may be incorporated. Other impurities, for example, Be, Mg, Ca, Sr, Ba, O, or S, may be added to modify the bandgap of the CdZnSeTe crystals. The at least one dopant or impurity may be introduced as an impurity in the nutrient material or as a component of the solvent or the mineralizer. In the case where the dopant is incorporated into the nutrient material, the nutrient is preferably melted and quenched prior to use so that the dopant is homogenously distributed through the nutrient material. The concentration of the at least one dopant or impurity in the CdZnSeTe crystals will typically lie in the range of about $10^{15}$ cm$^{-3}$ to about $10^{21}$ cm$^{-3}$. The addition of dopants such as chlorine (Cl) should enable resistivities above $10^{11}$ Ω-cm in the CdTe and CZT crystals. Such resistivities are considerably higher than has been previously demonstrated in CdTe but should be achievable due to the expected higher crystal quality. For example, GaN grown in supercritical ammonia has a carrier concentration lower by $10^3$-$10^4$ than GaN grown in liquid Ga despite similar impurity concentrations.

After the conclusion of the crystal growth run, the reactor is cooled and the chamber is removed from the high pressure apparatus. The chamber is cut open and the crystals removed. The crystals may be washed using at least one of water, inorganic acids, inorganic bases, organic solvents, organic acids, and organic bases. The crystals may be sawed into wafers, cubes, or other shapes by means of a wire saw, annular saw, or other method. The cut surfaces of the sawed crystals may be chosen to have an orientation within about 10° of the (111), ($\overline{111}$), (110), (100) crystallographic orientations. After cutting, the crystals may be lapped and polished by methods that are well known in the art. To remove residual surface damage resulting from sawing, lapping, or polishing, the crystals may be etched in 1% Br$^2$ in methanol. For incorporation into a radiation detector device, the crystal surfaces may then be passivated by treatments such as $H_2O_2/NH_4F$ or plasma oxidation. Au electrodes, with a coplanar grid anode and a solid cathode, may then be deposited by either electroless or sputter deposition.

The crystal growth process is expected to achieve dramatic reductions in the concentration of inclusions, grain boundaries, micropipes, and cracks and to demonstrate an electron mobility-lifetime product µτ greater than 1-2×10$^{-2}$ cm$^2$/V. Crystals produced with the method disclosed herein may be used to manufacture large-volume gamma and x-ray radiation detectors and spectrometers with an energy resolution better than 2% at 662 keV, which in turn should enable low-cost discrimination between naturally occurring radioactive materials (NORM), special nuclear materials (SNM), and common medical and industrial radioisotopes in a hand-held detector or in an imaging array. The crystals should also be useful as components of area search devices or gamma ray imaging arrays. In addition, crystals produced by the inventive method may be useful as direct conversion x-ray detectors, dual- or multi-energy x-ray detectors, x-ray spectrometers, as components of x-ray imaging arrays, and as components of x-ray computed tomography systems.

The disclosed crystal growth method should yield, for example, 1×1×0.5 cm$^3$ CdTe and CZT single crystals with a resistivities greater than $10^{11}$ Ω-cm and electrical properties implying capability for an energy resolution of 2% at 662 keV and room temperature. It is expected that CZT crystals grown with the HPHT process disclosed herein will have resistivities in a range $10^9$ Ω-cm to $10^{11}$ Ω-cm. CdTe crystals may also be grown with similar resistivities. The crystal size is expected to be increased to 4 cm$^3$, 16 cm$^3$, 27 cm$^3$, 125 cm$^3$ and larger, with the disclosed method. The photopeak efficiency in a one cm crystal cube should be at least as high as standard material, e.g., 8% at 662 keV. A crystal having a size of 4 cm$^3$ and format of CdTe or CZT crystals should produce a photopeak count rate of about 14 sec$^{-1}$ at an exposure level of 50 µR/hr of 662 keV gamma rays, per ANSI N42.34 8.1.2, enabling an increase above background to be detected in 1 sec with less than a 1% probability of error.

A resolution of 2% at 662 keV should allow for ready identification of each of the SNM, NORM, medical, and industrial radionuclides in ANSI N42.34 singly or in pairs. The crystal may comprise a portion of at least one of a gamma radiation detector, a gamma ray spectrometer, an area search device, a gamma ray imaging array, a direct conversion x-ray detector, a dual- or multi-energy x-ray detector, an x-ray spectrometer, an x-ray imaging array, and an x-ray computed tomography system.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for growing Cadmium Telluride (CdTe) and Cadmium Zinc Telluride (CZT) crystal comprising:
    positioning a plurality of CZT or CdTe seed crystals in a growth zone of a reactor chamber divided by a porous baffle into the growth zone and a nutrient zone;
    positioning CZT or CdTe nutrient material in the nutrient zone;
    filling the reactor chamber with a solvent fluid;
    pressurizing the reactor such that the solvent fluid becomes supercritical;
    heating the reactor such that the nutrient zone is warmer than the growth zone;
    dissolving the nutrient material into the supercritical fluid;
    transporting the supercritical fluid with dissolved nutrient through the baffle and to the growth zone, and
    growing crystals from the seed crystals as the dissolved nutrients deposit on the crystals, wherein the growth zone temperature is at least 450° C. and the reactor pressure is at least 700 bar.

2. The method of claim 1 further comprising heating the nutrient zone to a temperature that is at least 5° C. different than the growth zone, and transporting the supereritical fluid is by convection.

3. The method of claim 1 wherein the solvent fluid comprises a mineralizer.

4. The method of claim 1 wherein positioning the seed crystals further comprises suspending the seed crystals in the chamber.

5. The method of claim 1 wherein positioning the seed crystals further comprises suspending more than one hundred seed crystals in the chamber.

6. The method of claim 1, further comprising sealing the reactor chamber and subsequently placing the sealed reactor chamber in a high pressure apparatus and thereafter performing the step of growing the crystals.

7. The method of claim 6 wherein the high pressure apparatus is a zero-stroke-type pressure apparatus.

8. The method of claim 1, wherein the CdTe or CZT nutrient material further comprises at least one compensatory dopant.

9. The method of claim 8, wherein the at least one compensatory dopant is selected from a group consisting of: Cl, Ge, Sn, In, B, Al, Ga, Tl, C, Si, Pb, N, P, As, Sb, Bi, F, Br, I, a transition metal, a rare earth metal, and H.

* * * * *